United States Patent [19]

Grassel et al.

[11] Patent Number: 4,964,055
[45] Date of Patent: Oct. 16, 1990

[54] HAND-HELD POWER SYSTEM HARMONIC DISTORTION METER WITH SELECTIVE ACTIVATION OF DISPLAY

[75] Inventors: Wayne E. Grassel, Bethel Park; Mark F. McGranaghan, McDonald, both of Pa.

[73] Assignee: Cooper Industries, Inc., Houston, Tex.

[21] Appl. No.: 125,548

[22] Filed: Nov. 25, 1987

[51] Int. Cl.⁵ .............................................. G01R 23/16
[52] U.S. Cl. .................................. 364/485; 324/77 B; 364/481; 364/576
[58] Field of Search ............... 364/827, 576, 487, 485, 364/483, 481; 324/57 DE, 77 B

[56] References Cited

U.S. PATENT DOCUMENTS

| 3,881,097 | 4/1975 | Lehmann et al. | 364/485 |
| 4,264,859 | 4/1981 | Blaess | 364/553 |
| 4,264,959 | 4/1981 | Blaäss | 324/57 DE |
| 4,346,268 | 8/1982 | Geerling | 381/58 |
| 4,633,411 | 12/1986 | Bliss et al. | 364/481 |
| 4,672,555 | 6/1987 | Hart et al. | 364/483 |

OTHER PUBLICATIONS

"10 The Fast Fourier Transform (FFT)", pp. 149–169, author and date unknown.

Primary Examiner—Parshotam S. Lall
Assistant Examiner—S. A. Melnick
Attorney, Agent, or Firm—Wigman & Cohen

[57] ABSTRACT

A hand-held, battery-powered harmonic distortion meter reduces the level of the AC power waveform of interest to a level compatible with the measurements to be performed, converts successive portions of the reduced waveform to digital representations in a multi-bit format for processing, stores a predetermined number of sequences of the digital representations, processes the stored sequences according to a fast Fourier transform algorithm using time decomposition with input bit reversal to produce intermediate calculations of the real and imaginary parts of the DC, fundamental frequency and harmonic components of the input waveform, further processes the intermediate calculations to obtain various parameters of the input waveform including magnitude of the harmonic components as a percentage of the fundamental frequency of the waveform, and selectively displays the final calculations according to switch selections on the face of the meter.

5 Claims, 3 Drawing Sheets

HAND-HELD POWER SYSTEM HARMONIC DISTORTION METER WITH SELECTIVE ACTIVATION OF DISPLAY

FIELD OF THE INVENTION

The present invention relates generally to devices for measuring harmonic distortion levels in power systems, and more particularly to a hand-held, battery-powered instrument for doing so utilizing fast Fourier transform processing of digital representations of an AC power waveform.

DESCRIPTION OF THE PRIOR ART

In the past, various techniques have been developed for the purpose of detecting distortion in signals of interest, with a view toward identifying and isolating the causes and correcting them. In one prior art system, described by Terui et al in U.S. Pat. No. 4,267,515, a distortion factor meter circuit utilizes first and second transmission lines, and the signal wave of interest, which has harmonic components, is converted into first one and then another signal and then subjected to level comparison with a signal on another transmission line to produce a string of ones and zeroes which are integrated to produce a sum indicative of the distortion of the signal wave of interest.

In U.S. Pat. No. 4,417,310 to Sugihara, apparatus is described for measuring extremely small distortion factors of analog signals, wherein sampled values of the analog signal of interest are converted to digital values, stored, reconverted to analog values after proper phase sequencing at a selected frequency, filtered, and the distortion factor finally measured as a ratio between the detected level of the filtered output signal and the level of the fundamental frequency of the input signal.

McEachern et al, in U.S. Pat. No. 4,694,402, disclose an AC waveform analyzer for detecting disturbances including voltage errors, sudden drops and impulses, frequency errors, and noise. A converter samples the waveform, generates a plurality of samples and converts them into digital signals. The digital signals are then evaluated to detect disturbances in the waveform, by comparing a particular one of the digital signals representing one of the samples in a particular periodic cycle of the waveform with a corresponding one of the digital signals representing a corresponding sample from the remaining cycles of the waveform.

Such prior art waveform detectors and analyzers are not effective to provide highly accurate measurements of harmonic distortion and/or related parameters such as magnitudes of harmonic components and the like, particularly for power systems, nor to provide means for doing so in a lightweight portable instrument.

It is therefore a principal object of the present invention to provide an instrument for measuring harmonic distortion in commercial power systems, which provides a highly accurate indication of the extent of such distortion and the components thereof, and which does so in a small and relatively inexpensive package in comparison to the prior art devices proposed and developed for such purposes.

SUMMARY OF THE INVENTION

According to the present invention, a hand-held, battery-powered harmonic distortion meter is provided which is adapted to reduce the level of the AC power waveform of interest to a level compatible with measurements to be performed by such a device, convert successive portions of the reduced waveform to digital representations thereof in a multi-bit format suitable for processing, store a predetermined number of sequences of the digital representations in the multi-bit format, process the stored sequences according to a fast Fourier transform algorithm using time decomposition with input bit reversal to provide intermediate calculations of the real and imaginary parts of the DC, fundamental frequency and harmonic components of the input waveform, further process the intermediate calculations to obtain at least the magnitude of the harmonic components as a percentage of the fundamental frequency of the waveform, and selectively display the final calculations according to the desire of the operator of the instrument.

According to an important feature of the invention, the components of the meter utilized for A/D conversion, processing, timing, storage, and display are fabricated in CMOS integrated circuit form, such that the meter is of very light weight (less than two pounds in a constructed embodiment), relatively inexpensive (less than $3,000.00 for the constructed embodiment), and operable with low power (using six AA nickel-cadmium batteries in the constructed embodiment).

Moreover, the portable meter of the present invention is quite accurate, inasmuch as the sampling is synchronized to the fundamental frequency of the waveform of interest, the meter utilizes a highly accurate fast Fourier transform algorithm with time decomposition and input bit reversal, and further because the accuracy of the data acquisition, as measured by the digital resolution of each conversion and the time between conversions, is also high. Further, linear A/D errors such as full scale error and voltage reference error are eliminated in the computation of the harmonic levels as a percentage of the magnitude of the fundamental frequency of the waveform of interest.

Therefore, it is another object of the present invention to provide a small, lightweight harmonic distortion meter for power systems, which provides highly accurate calculations for pure power system harmonic analysis.

Still another object of the invention is to provide a portable instrument for measuring harmonic distortion and related parameters in power systems, using fast Fourier transform (FFT) processing of digital representations of portions of an AC power input signal, and in which the FFT uses time decomposition with input bit reversal of the digital representations.

It should be noted, of course, that there are many prior art signal wave analyzing instruments based on use of an FFT algorithm. Although some of these may be suitable for harmonic analysis, few are suitable for power system use, and they present drawbacks with respect to accuracy and the fact that significant data manipulation must be performed by the user to put the information in proper form. An example of a prior art instrument using FFT is the time delay spectrometer described by Heyser in U.S. Pat. No. 4,279,019, for determining the manner in which an initial impulse of wave energy from a transmitter is modified by a transmission medium, including measurement of fundamental frequency and harmonic components. According to Heyser, a desired signal is detected at the output of a tracking filter centered on an intercepted signal, with the time delay components of the signal at the output of the filter appearing in terms of frequency and the frequency components appearing in terms of time delay. This output is then processed using FFT.

BRIEF DESCRIPTION OF THE DRAWINGS

The above and still further objects, features, and attendant advantages of the present invention will become apparent from a consideration of the ensuing detailed description of a preferred embodiment thereof, taken in conjunction with the accompanying drawing in which.

DESCRIPTION OF THE PREFERRED EMBODIMENT

Figure 1:
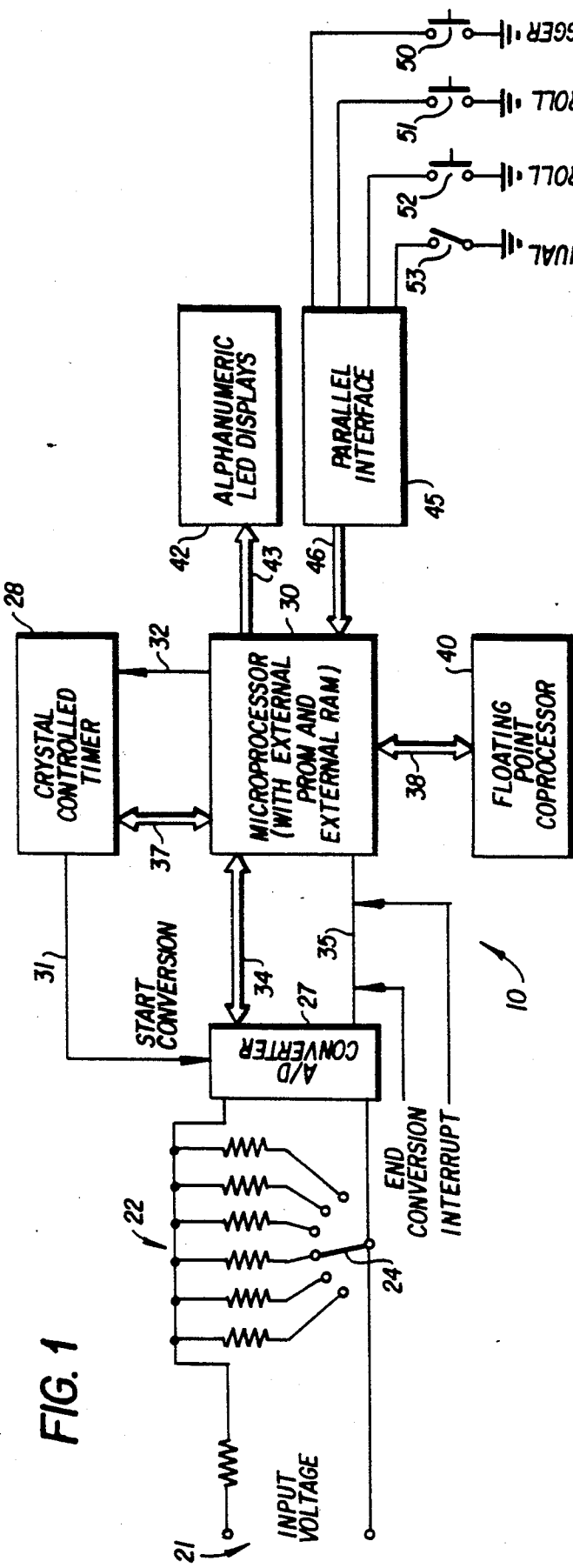
FIG. 1 is a circuit hardware block diagram of a preferred embodiment of the hand-held meter according to the invention.

The present invention is directed to a portable, relatively inexpensive meter for accurately measuring and monitoring harmonic distortion levels on power systems. Referring to FIG. 1, a preferred embodiment of a hand-held meter 10 according to the invention includes an input connector having terminals 21 to be coupled to a voltage or current source (not shown) which provides an input electrical waveform, specifically a power system voltage having a 60 Hertz fundamental frequency, to the connector. The input terminals 21 are connected to a resistive divider 22 whose ratio is selectable at will by means of a multi-position switch 24 available for selection on the face of the meter case. The output terminals of the resistive divider 22 are connected to input terminals of a 13-bit (12 bit plus sign) analog-to-digital (A/D) converter 27. A quartz crystal-controlled timer chip 28 is connected for issuing commands to the A/D converter and receiving commands from a microprocessor 30 on signal paths 31 and 32, respectively.

The output data from A/D converter 27 is applied as an input to the microprocessor via a unidirectional data bus 34, and a separate signal path 35 is provided for inputting end of conversion signal commands to the microprocessor. The microprocessor is coupled to the timer 28 and to a floating point coprocessor 40 for data transfer through respective bi-directional data buses 37 and 38. The microprocessor also supplies data to alphanumeric light-emitting diode (LED) displays 42 by way of a unidirectional data bus 43. Commands from a set of user controls on the front face of the meter case are inputted to microprocessor 30 through a parallel interface chip 45 and a bus 46. The user controls consist of push button, momentary contact switches 50, 51 and 52 for "manual trigger", "fast scroll" and "slow scroll" commands, respectively, and a selector switch 53 for selection of automatic or manual mode ("auto/manual mode"), each of which is electrically connected to the parallel interface chip.

Each of the hardware components employed in the circuit of the hand-held meter 10 is entirely conventional and the circuitry is preferably fabricated in semiconductor integrated circuit (IC) form. In particular, each of A/D converter 27, timer 28, microprocessor 30 and associated memory, alphanumeric LED displays 42, and parallel interface 45 is preferably fabricated in complementary metal-oxide-silicon (CMOS) chip form, such standard components being available from numerous IC vendors. For example, the microprocessor is preferably a standard 80C88 CMOS chip with 32K bytes of external read-only memory (ROM, or programmable read-only memory, PROM) and 8K bytes of external random access memory (RAM), both such types and capacities of memory also readily available in standard CMOS chips. CMOS components exhibit very low power dissipation, and consequently are desirable for use in a battery-operated instrument. Floating point coprocessor 40 is not presently available in CMOS form, but can be obtained as an NMOS (N-channel MOS) chip with the part number 8087. However, the use of coprocessor 40 is optional, in that the same processing may be emulated in software within the microprocessor 30; and because NMOS consumes considerably greater power the software emulation is desirable to assure battery-powered operating capability for the meter 10. The microprocessor, floating point coprocessor, RAM and PROM are available from Intel Corporation of Sunnyvale, Calif., or from a second source thereof. Power to the overall meter may be supplied by conventional appropriately rated batteries (not shown), which may be retained in a compartment provided in the case (not shown).

The operation of the hand-held meter 10 will be described with reference to FIGS. 1 through 6. A power system voltage or current of 60 Hz fundamental frequency is presented to the meter at the input connector 21 through a suitable voltage transformer or current transformer with burden. The voltage input to the meter should be less than 300 volts RMS. The switch selectable resistive divider 22 is utilized to reduce the peak value of the input signal to less than 5 volts, and this reduced voltage is applied directly to the 13-bit A/D converter 27. Preferably, a back-to-back zener diode pair (not shown) is provided at the input to the A/D converter to protect the components of the meter against destruction from overly high signal levels attributable to erroneous settings of resistive divider 22.

The quartz crystal-driven timer chip 28, whose crystal also provides the microprocessor clock signal, is employed for accurate clocking of the A/D conversions. These conversions are taken in blocks of 128 13-bit bipolar points equally and accurately spaced over one cycle of the 60 Hz input signal. Microprocessor 30 controls the timing at which each block of A/D conversions is taken by enabling (command on path 32) the timer output to the "start conversion" (command on path 31) input of the A/D converter which interrupts the microprocessor by an appropriate command input on path 35. The microprocessor thereupon inputs the completed 13-bit conversion from data bus 34 and waits for timer 28 to initiate the next "start conversion" command to the A/D converter. After the 128th conversion, microprocessor 30 disables the timer output to the A/D converter.

Figure 2:
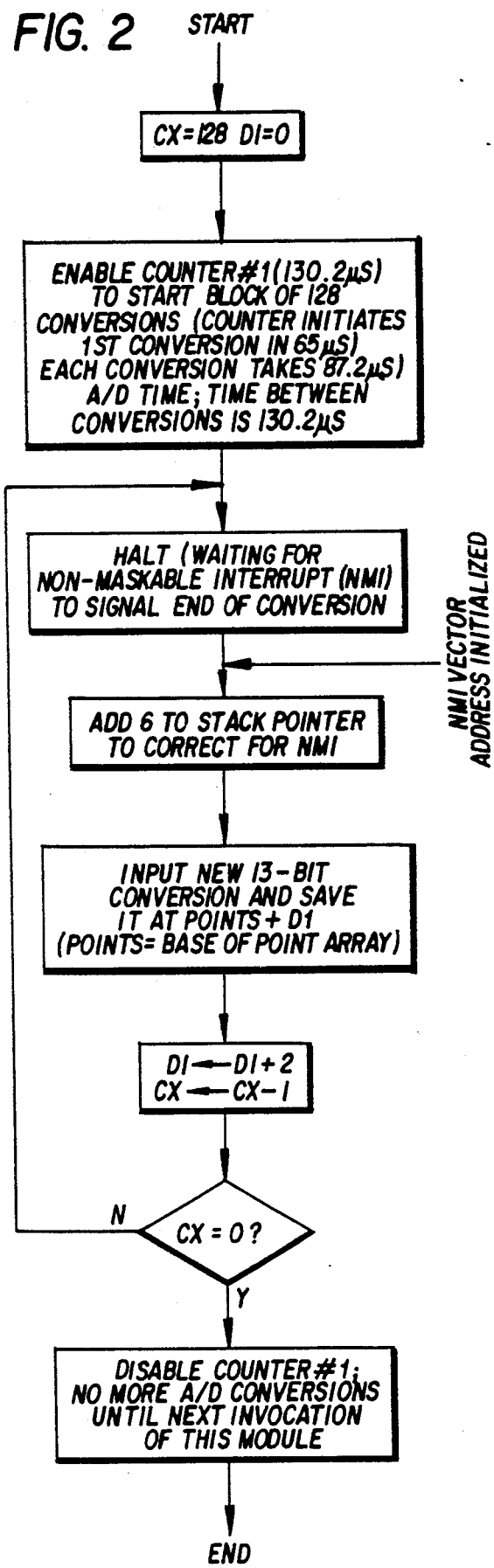
FIG. 2 is a chart of the data acquisition software used by the circuit hardware of FIG. 1.
Figure 4:
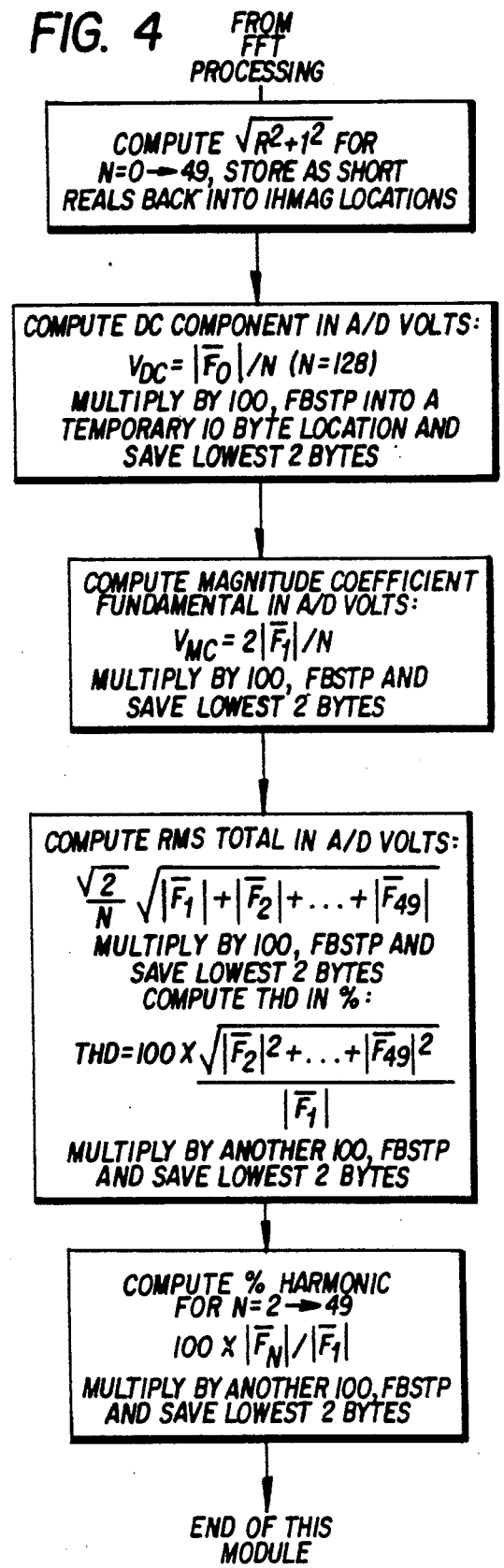
FIG. 4 is a chart of the post-FFT, pre-display processing software used by the circuit hardware of FIG. 1.

The data acquisition software is as shown by the software flow chart of FIG. 2. At the start, the internal count register (CX) in the 80C88 microprocessor 30 is at 128, and the destination index register (DI) is at 0. Counter #1 is enabled to start the block of 128 conversions. The first conversion is initiated in 65 microseconds, and each conversion in the block of 128 conversions is completed in 87.2 microseconds of A/D converter time. The time between conversions is 130.2 microseconds. After each interrupt, a correction is made to the stack pointer to account for that interrupt, and the new 13-bit conversion which has just been completed is inputted to the microprocessor and stored in its associated memory, the first conversion being stored at the base of the points array with successive points being stored in successive locations. The process continues until CX=0, at which time the counter #1 is disabled, and no further A/D conversions are implemented until the next invocation of the data acquisition module.

Figure 5:
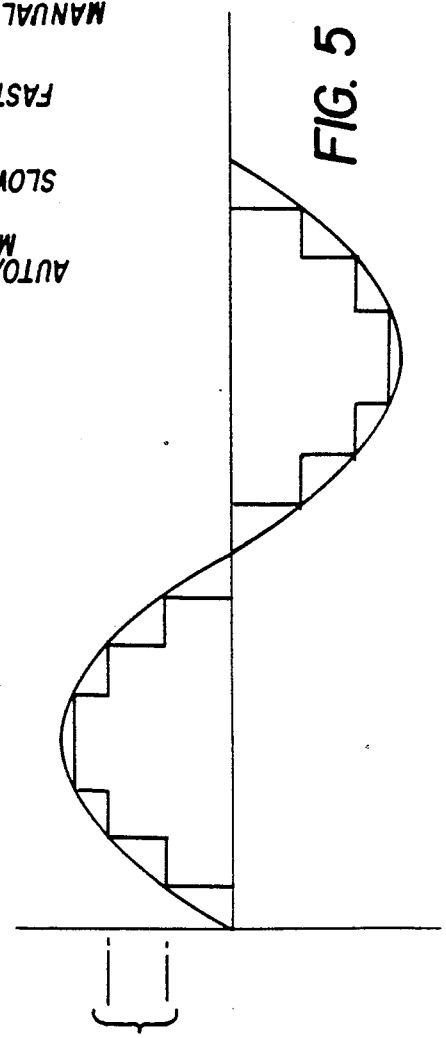
FIG. 5 is a graph showing the effect of A/D digitization of the input signal.

With this data acquisition method, the conversion spacing in time is dependent only on the quartz crystal accuracy, and not on variable microprocessor software delays or interrupt response times. The effect of the A/D digitization is shown in FIG. 5, which will be discussed presently.

At this point in the data processing, an FFT routine is executed. To that end, the block of 128 points of A/D conversions of 13 bits each are converted to 32-bit floating point quantities by the floating point coprocessor 40, with data being supplied back and forth between the latter and the microprocessor on bus 38. As noted above, the coprocessor 40 processing may be emulated in software within the microprocessor, but at the expense of slower process time and increased power consumption. After the 32-bit conversions, an NlogN FFT routine is performed using all floating point calculations to assure accuracy. All intermediate results are stored in IEEE Standard 754 80-bit floating point format.

Figure 3:
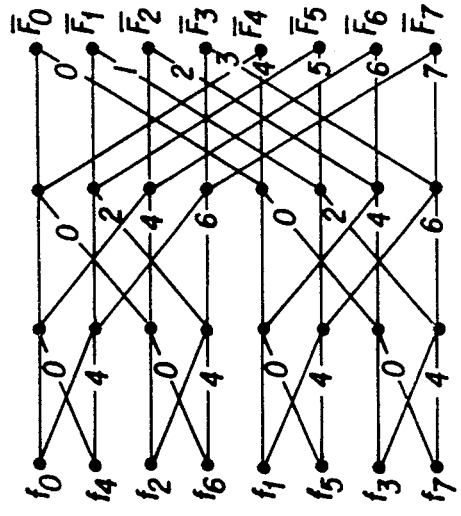
FIG. 3 is a signal-flow diagram of the time decomposition FFT routine with input bit reversal used in signal processing by the circuit hardware of FIG. 1.

According to a feature of the invention, the FFT routine uses time decomposition with input bit reversal, and serves to reduce the number of complex products required (compared to a straight discrete Fourier transform algorithm) from 16,384 (i.e., $128^2$) to 448 (i.e., $64 \times \log_2 128$). This technique yields a considerable improvement in computational throughput. An example of the time decomposition FFT routine with input bit reversal is indicated in FIG. 3 in signal-flow diagram format, with N=8. The signal-flow diagram for N=128, representative of the algorithm actually used, is substantially larger than that of FIG. 3, of course, but is of the same form. In FIG. 3, flow is from left to right, with inputs designated $f_n$ and outputs designated $F_n$, the outputs being complex, in general. Also, each broken line in FIG. 3 with n (0, 1, ..., 8) in the break indicates multiplication by $e^{-j(2\Pi n/8)}$; and two lines entering a junction from the left indicates addition.

The outputs of the FFT routine are the real and imaginary parts of the DC, fundamental frequency, and harmonic components of the input signal up to the 64th harmonic (3,840 Hz). However, in practice only data relating to up to the 49th harmonic is ultimately displayed on the meter of the present embodiment. This selection is based on Shannon/Nyquist sampling theorem to avoid possible errors which might arise by including harmonics greater than the 49th harmonic. Further, accuracy of power system voltage insulation transformers and current isolation transformers becomes problematical at frequencies beyond 3,000 Hz (50th harmonic). All of the quantities are stored in the 32-bit floating point format.

The outputs of the FFT routine are then processed by microprocessor 30 and stored to selectively provide the output on bus 43 to the 12-character alphanumeric display 42 used in the meter 10. The preferred method of post-FFT pre-display processing according to the invention is indicated by the flow chart of FIG. 4. For each harmonic, the real and imaginary components are combined to obtain the absolute magnitude. These are divided by the magnitude of the fundamental component and then multiplied by 100 to obtain the magnitudes of the harmonic components as a percentage of the magnitude of the fundamental frequency. The final calculated percent harmonic levels are converted to ASCII characters for output to the alphanumeric display. In the first block of the processing software chart of FIG. 4, the symbol IHMAG refers to the imaginary harmonic magnitude; in the second and remaining blocks of that FIG., the symbol $\uparrow \overline{F} \uparrow$, of course, refers to L absolute value of $\overline{F}$, and the symbol FBSTP refers to floating point, binary-coded decimel, store, and pop the floating point stack. The computations performed by the post-FFT, pre-display processing are clearly indicated in FIG. 4, and require no further explanation. It is sufficient to note that at the end of this software module, the entire process (commencing with the A/D conversion) is repeated.

The outputs selectively available on the alphanumeric display 42 as a result of this processing are the following: (i) harmonic components 2 through 49, in percent of the fundamental component; (ii) total harmonic distortion (THD); (iii) telephone interference factor (TIF), which is an IEEE-defined number constituting the weighted THD over the audio range of frequencies of interest in telephone communications; (iv) DC component; (v) magnitude of the fundamental frequency component; and (vi) RMS value of the total signal. It will be appreciated, however, that additional parameters of possible interest acquired from the processing may also be stored and made available for display, if desired.

These stored outputs can be accessed for display through the two momentary contact switches 51 and 52, which are manually actuable (as are switches 50 and 53, also) on the front face of the hand-held meter 10 by the operator. As previously noted, each switch is coupled to the microprocessor via the parallel interface 45. Depressing the "slow scroll" switch 52 enables scrolling through all of the display parameters one at a time, at approximately two seconds per parameter, whereas depressing the "fast scroll" switch 51 produces a fast scrolling through the parameters at a rate of approximately 0.25 second per parameter.

The "auto/manual mode" selector 53 is a toggle switch whose position determines the mode of operation for the meter 10. In the "manual" position, the "manual trigger" button 50 may be depressed by the operator to initiate a sequential data acquisition/FFT computation/display update process. If an 8087 floating point coprocessor 40 is used (rather than software emulation for that processing), this entire process initiated by the manual actuation takes approximately 0.4 second. If, instead, software emulation is employed, the resulting process time would be about 24 seconds. The display 42 is updated for the last parameter selected using the scrolling switches; all other parameters are updated in memory and can be viewed using the scrolling switches. In the "auto" position of toggle switch 53, the data acquisition/FFT computation/display update process is continuously performed (approximately every 0.4 second), and the last parameter selected for display is continuously updated.

The two main components of computational accuracy in the portable meter of the present invention are the data acquisition accuracy and the FFT algorithm accuracy. The accuracy of the FFT algorithm is dependent on the digital roundoff of the intermediate calculations, and since all intermediate results are represented in 80-bit floating point format, the FFT algorithm may be assumed to be exact in comparison to the data acquisition accuracy.

The accuracy of the data acquisition can be assessed by looking at its two parts; namely, the digital resolution of each conversion and the time spacing between conversions. It should be observed that all linear A/D errors such as full scale error and voltage reference error are eliminated in the computation of the magnitudes of the harmonic components as percentages of the magnitude of the fundamental frequency component.

As indicated in FIG. 5, which shows the effect of A/D digitization, with 12 bit plus sign A/D conversions the digital resolution is $1/4095 \times 100\%$, or approximately 0.02% of full scale. For FFT computational accuracy, a given harmonic component should be at least three times this digital resolution, thereby providing a minimum of four unique digital levels per half cycle. Thus, if the input resistive divider 22 is adjusted so that the fundamental component peak is approximately full scale (for example, 5 volts), the lowest harmonic magnitude amenable to accurate resolution is approximately $3 \times 0.02\%$, or 0.06%.

The same analysis applies to incremental magnitude changes of a given harmonic component. Thus, the magnitude accuracy attributable to the discrete steps of the A/D converter is $+/-0.06\%$, but the accuracy is reduced if the peak of the input signal is less than full scale (5 volts). Typically, the input divider 22 may be selected to yield 3.5 volts peak input signal, thereby increasing the resolution inaccuracy to $+/-0.086\%$.

Figure 6:
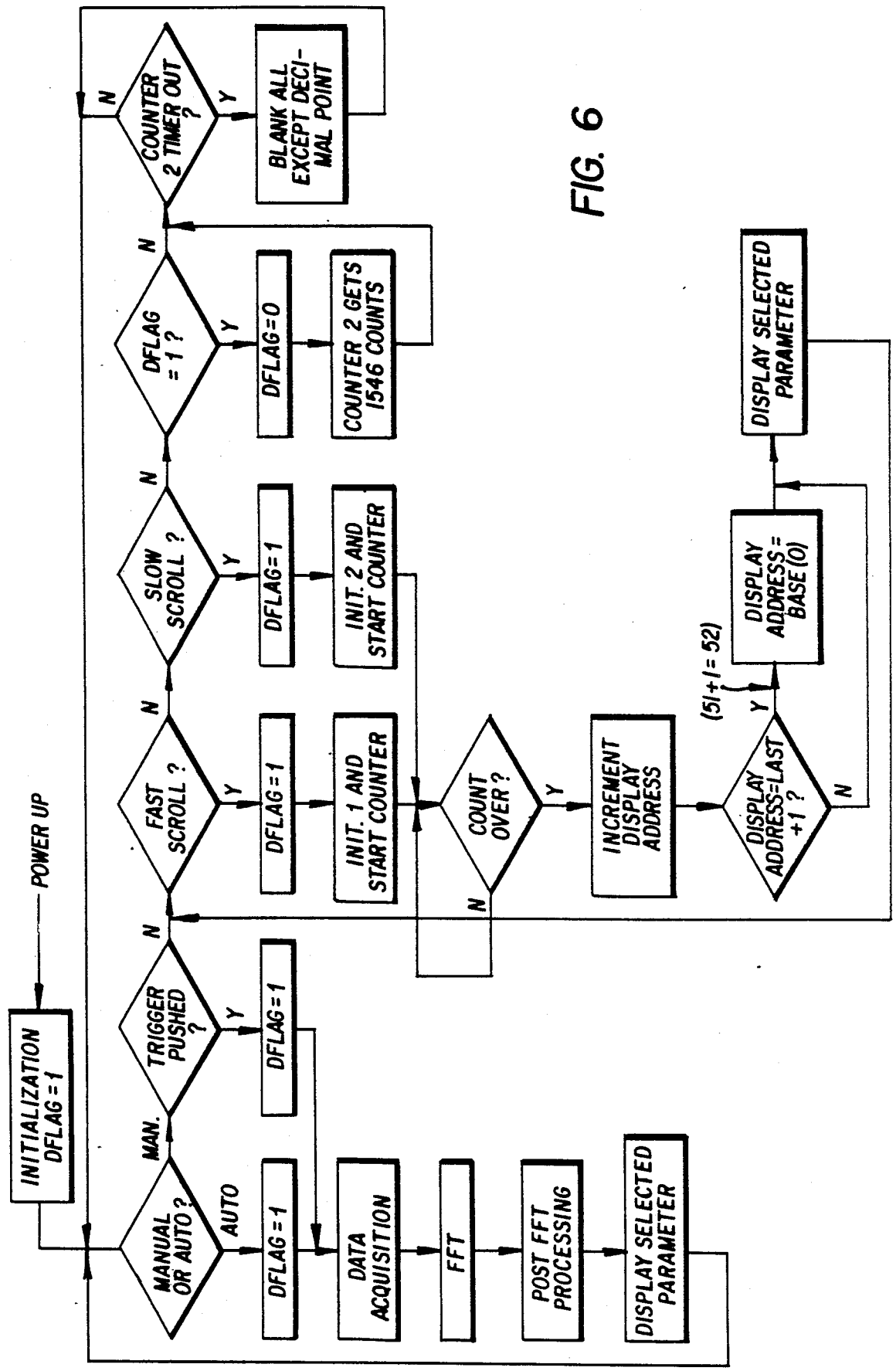
FIG. 6 is a flow chart diagram illustrating the overall logic flow in the software/hardware system of FIG. 1.

The time spacing between conversions is generated by timer chip 28 which is programmed, for example, to divide a crystal-generated 5 MHz signal by 651. As previously noted, this yields a conversion spacing of 130.2 microseconds. When this time spacing is compared with the ideal conversion spacing of $10^6/(60 \times 128)$ microseconds, a timing error of 0.0064% is obtained. The 5 MHz crystal accuracy is typically 50 parts per million (ppm), or 0.005%. Therefore, the total time spacing error possible is 0.0114% and the RSS (root sum of squares) error is 0.008%. If it is assumed (1) that these errors result in proportional errors in the harmonic magnitudes, and (2) that an exact 60 Hz power frequency signal is being analyzed, both of which are reasonable assumptions, the total calculated harmonic measurement error is $+/-(0.086\% + 0.0114\%)$, or approximately $+/-0.1\%$ The overall logic flow chart shown in FIG. 6 is self-explanatory from the foregoing description of the preferred embodiment. It will be observed from the preceding disclosure that the presently preferred embodiment of a portable meter according to the present invention provides highly accurate computations of the harmonic components and total harmonic distortion of the power frequency under analysis, as well as of the other parameters derived from the calculations.

Although a presently preferred embodiment of the present invention has been described herein, it will be readily apparent to those of ordinary skill in the field to which the invention pertains that many variations and modifications of this embodiment may be implemented without departing from the spirit and scope of the invention. By way of example, the meter may be interfaced to a personal computer for automatic collection of data such as that which has been described pertaining to the input power frequency signal. Hence, it is intended that the invention shall be limited only to the extent required by the appended claims and the applicable rules of law.

What is claimed is:

1. A hand-held meter for measuring harmonic distortion of an AC power waveform, comprising CMOS memory means for sequentially collecting digital data constituting multi-bit representations of portions of said waveform; CMOS microprocessor means including calculating means responsive to the collection of a predetermined quantity of said digital data for performing intermediate calculations of the real and imaginary parts of the DC, fundamental frequency and harmonic components of said waveform; processing means for processing said intermediate calculations to obtain at least the magnitudes of the harmonic components of said waveform as a percentage of the fundamental frequency component of said waveform;

an alphanumeric display means for displaying said harmonic component magnitudes; and switch means for selectively commanding said processing means to deliver the processed calculations to said alphanumeric display means for readout thereon.

2. A hand-held meter for measuring harmonic distortion of an AC power waveform, comprising CMOS memory means for sequentially collecting digital data constituting multi-bit representations of portions of said waveform; CMOS microprocessor means including calculating means responsive to the collection of a predetermined quantity of said digital data for performing intermediate calculations of the real and imaginary parts of the DC, fundamental frequency and harmonic components of said waveform; processing means for processing said intermediate calculations to obtain at least the magnitudes of the harmonic components of said waveform as a percentage of the fundamental frequency component of said waveform;

an alphanumeric display means for displaying said harmonic component magnitudes;

switch means for selectively commanding said processing means to deliver the processed calculations to said alphanumeric display means for readout thereon;

wherein said processing means further processes said intermediate calculations to obtain the magnitude of the DC and fundamental frequency components of said waveform and the total harmonic distortion of said waveform, and wherein said switch means includes means for enabling scrolling of the obtained parameters of said waveform on said alphanumeric display means.

3. A hand-held, battery-operated instrument for measuring harmonic distortion in power systems, comprising divider means for reducing the magnitude of an AC input signal to be analyzed; analog-to-digital converter means for digitizing the reduced-magnitude signal into multi-bit sequences; processing means for subjecting the multi-bit sequences to fast Fourier transform processing with time decomposition and input bit reversal to provide output data indicative of the real and imaginary parts of the DC, fundamental frequency and harmonic components of the input signal; program means responsive to the output data for determining therefrom at least the magnitude of the harmonic components of said input signal as a percentage of the magnitude of the fundamental frequency thereof, and the total harmonic distortion of said input signal; display means for selectively displaying the parameters determined by the program means; and switch means for selecting the parameters to be displayed on said display means.

4. The instrument of claim 3, wherein each of said converter means, said processing means, said calculating means and said display means is fabricated in CMOS integrated circuit form.

5. The instrument of claim 4, wherein the circuitry is powered by batteries.

* * * * *